United States Patent [19]

Konopka

[11] Patent Number: 4,906,938
[45] Date of Patent: Mar. 6, 1990

[54] POWER CIRCUIT LOCATER

[75] Inventor: John G. Konopka, Barrington, Ill.

[73] Assignee: Zenith Electronics Corporation, Glenview, Ill.

[21] Appl. No.: 232,961

[22] Filed: Aug. 16, 1988

[51] Int. Cl.$^4$ .................. G01R 31/02; G01R 31/08
[52] U.S. Cl. ........................................ 324/529; 324/66
[58] Field of Search ................ 379/25; 324/529, 539, 324/66, 67

[56] References Cited

U.S. PATENT DOCUMENTS

| 3,924,179 | 12/1975 | Dozier | 324/66 |
| 4,121,152 | 12/1978 | Hale | 324/66 |
| 4,129,825 | 12/1978 | Brinegar | 324/66 |
| 4,556,839 | 12/1985 | George | 324/66 |
| 4,734,638 | 3/1988 | Weber | 324/66 |
| 4,801,868 | 1/1989 | Brooks | 324/66 |

FOREIGN PATENT DOCUMENTS

| 2566539 | 12/1985 | France | 324/66 |
| 1162811 | 8/1969 | United Kingdom | 324/66 |

Primary Examiner—Reinhard J. Eisenzopf
Assistant Examiner—Jose M. Solis

[57] ABSTRACT

A circuit locater includes a passive signal device adapted to be plugged into a power outlet to draw a large amplitude current pulse of very short duration (identification signal) from the power source supplying the outlet. A receiver has a pickup coil that senses the magnetic field generated by the identification signal current. A sensitivity control reduces the sensitivity of the pickup coil until an output signal is produced only when the receiving coil is adjacent to the circuit breaker of the electrical control panel that is supplying power to the passive signal device.

4 Claims, 2 Drawing Sheets

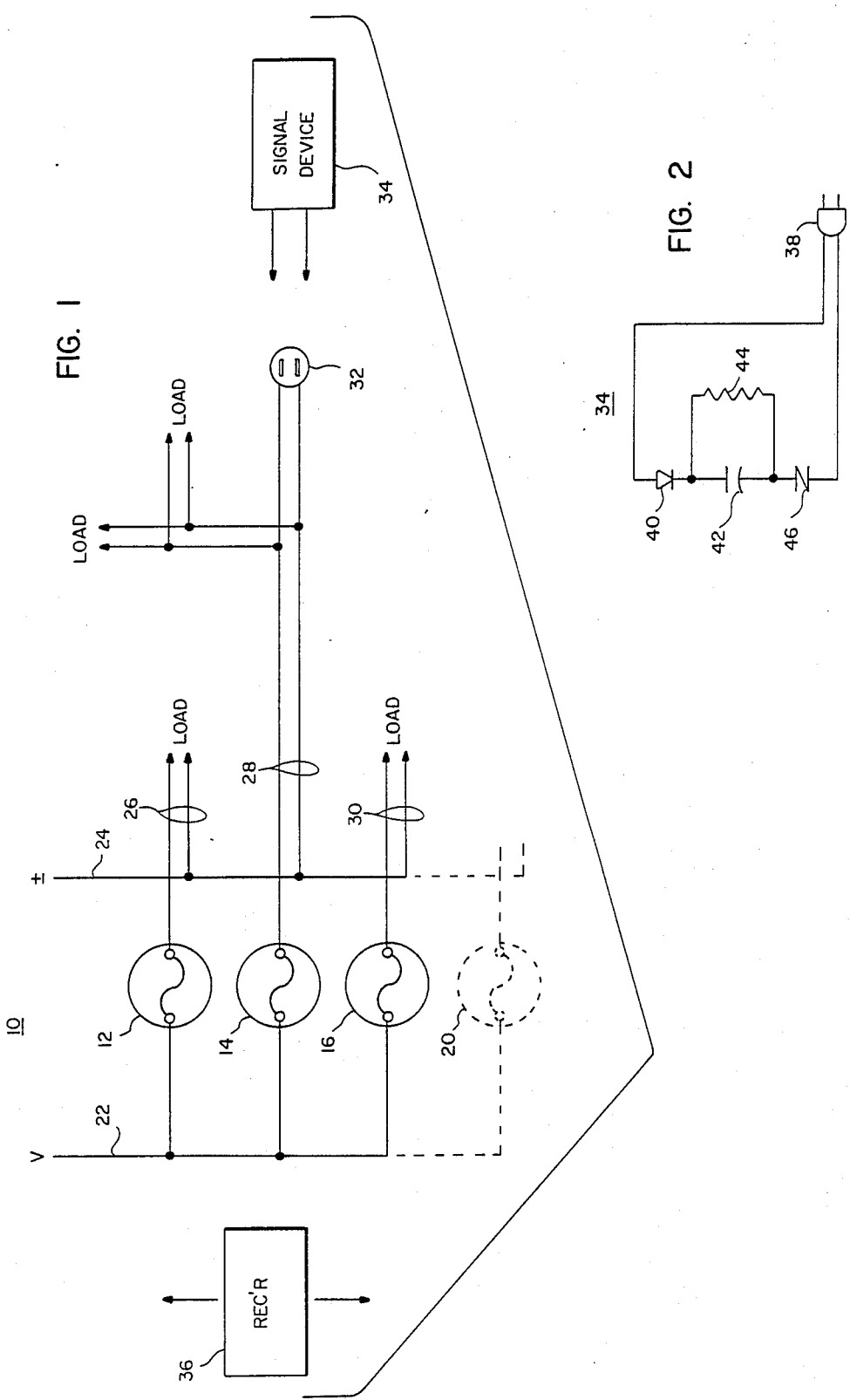

POWER CIRCUIT LOCATER

BACKGROUND OF THE INVENTION AND PRIOR ART

This invention relates generally to power line testing equipment and particularly to a power circuit locater for identifying which of a number of circuit interrupter devices is in the circuit that supplies a particular power outlet.

A common problem encountered by professional electricians (and home handymen) is that of identifying the circuit breaker or fuse in a building electrical power panel that is in the circuit that supplies power to a particular electrical power outlet receptacle, hereinafter referred to simply as an outlet. In certain environments, such as hospitals, it is important that the electrician not inadvertently interrupt power flow to a critical area in attempting to determine which of the many fuses or circuit breakers in the electrical power panel is associated with the specific outlet that is to be worked on.

There is a tester currently available for determining the fuse or circuit breaker that is in the power supply circuit for a particular outlet. The tester is quite expensive, selling for hundreds of dollars, and includes a transmitter that incorporates a high voltage transistor, a diode and a resistor, and a crystal oscillator. The transmitter is connected across the AC line (to the outlet) and develops an oscillatory signal of about 4.5 kHz. Basically it connects and disconnects a resistor across the AC line at a 4.6 kHz rate. The resistor is rated at about 10 watts and the tester draws about 100 ma of current. The system requires a very sensitive receiver to pick up the magnetic field from the very low amplitude 4.6 kHz signal current that flows to the outlet from the electrical panel via the house wiring. The receiver includes an analog to digital converter and a plurality of light emitting diodes (LEDs) which are progressively illuminated to indicate the intensity of the received signal. Further details of the circuit arrangements in this tester are not known. It is clear though that sophisticated circuitry is required in the receiver to reject the strong 60 Hz power signal.

The circuit arrangement of the invention, on the contrary, is of simple construction and has significantly lower cost. Its principle of operation is, however, substantially the same. A passive signal device is plugged into the outlet in question and an identification signal current is drawn over the circuit house wiring from the electrical panel or fuse box. The identification signal current that is drawn from the power source by the passive signal device is detected by a suitable receiver. In accordance with the invention, the identification signal is a single pulse having a very large amplitude and an extremely short duration (2.0 microseconds in the preferred embodiment). A repetition rate of about 7.0 Hz for the identification signal is selected to produce a distinct visual, and/or audio indication that is readily distinguishable from any other signals that may be present on the house wiring circuit. Because of the large amplitude of the identification signal current drawn from the AC power source, a broadly tuned and relatively insensitive receiver may be used. The necessity for complex and expensive 60 Hz rejection circuitry is therefore completely obviated. The result is a very simple, economical and accurate arrangement for determining the circuit breaker or fuse in an electrical power panel that supplies power to a particular outlet.

OBJECTS OF THE INVENTION

A principal object of the invention is to provide a novel power circuit locater.

Another object of the invention is to provide a simple low cost power circuit locater arrangement.

A feature of the invention is the inclusion of a circuit arrangement in the passive signal device for developing an identification signal comprising a large amplitude current pulse of extremely short duration drawn from the power source.

Another feature of the invention is the use of a low cost timer circuit that is triggered in response to detection of the identification signal for driving a visual and/or an audio signalling device.

BRIEF DESCRIPTION OF THE DRAWINGS

These and other objects and advantages of the invention will be apparent upon reading the following description in conjunction with the drawings in which;

FIG. 1 is a partial schematic diagram of an electrical power panel and associated branch circuit wiring indicating use of the inventive arrangement;

FIG. 2 is a schematic diagram of a passive signal device constructed in accordance with the invention.

DESCRIPTION OF THE PREFERRED EMBODIMENT

Figure 3:
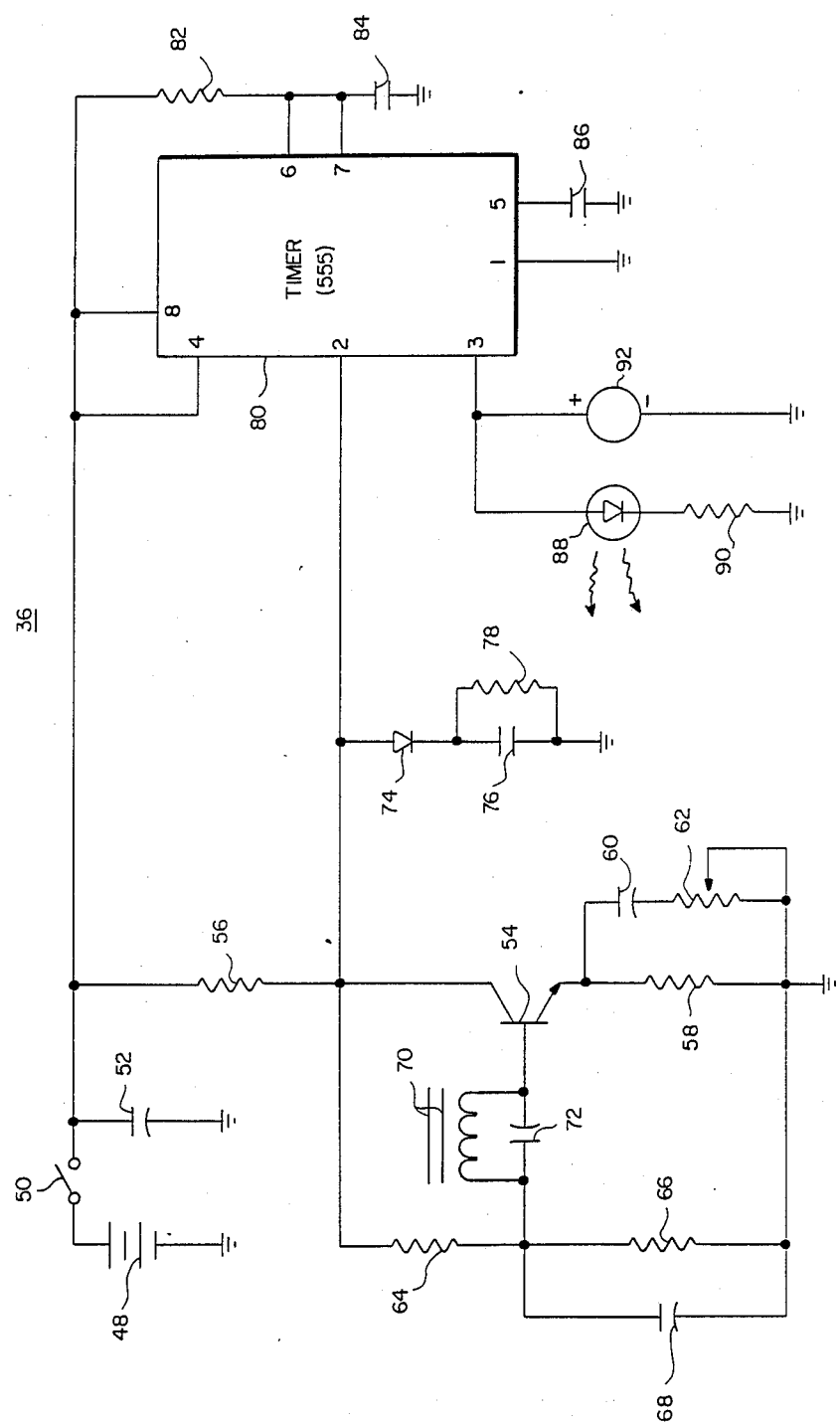
FIG. 3 is a schematic diagram of a receiver constructed in accordance with the invention.

Referring to FIG. 1, an electrical power panel 10 of conventional form has a plurality of fuses 12, 14, 16, 18 and 20. It should be understood that electrical power panel 10 may also comprise a series of circuit breakers or other types of switches for interruptibly supplying power to a plurality of load circuits (not shown) from a pair of AC power lines 22 and 24. Power line 22 is indicated as carrying a voltage V and line 24 is indicated as being a "neutral" and is identified by a ± symbol. Various branch electrical power circuits, consisting of wires corresponding to V and ±, are identified as circuits 26, 28 and 30. The circuit 28 includes branching circuits for supplying other loads and terminates in a power outlet 32. A passive signal device 34 is connectable to power outlet 32 to develop the identification signal as will be explained. A hand-held receiver 36 is physically movable adjacent to the electrical power panel 10 for picking up the magnetic field corresponding to the identification signal drawn by signal device 34.

In FIG. 2 passive signal device 34 is shown as including a conventional plug 38 for making electrical contact with outlet 32. The device itself consists of a diode 40 connected in series with the parallel combination of a capacitor 42 and a resistor 44 that, in turn, is connected in series with a Sidac 46. Sidac 46 has the characteristic of becoming a short circuit when the voltage thereacross attains a trigger level, called the threshold voltage, provided that a sufficient current is permitted to flow. Sidac 46, in accordance with the invention, is selected to conduct when approximately 135 volts is developed across its terminals, provided that it is connected in a circuit that has the capability of current flow.

Passive signal device 34 is connected to the AC power circuit 28 and, responsive to a conventional AC voltage thereacross, draws a large amplitude current pulse, which is the identification signal of the invention. The repetition rate of the identification signal is determined by the discharge time constant of the R-C circuit consisting of capacitor 42 and resistor 44 and the breakdown voltage of Sidac 46. This arrangement comprises a relaxation oscillator with diode 40 serving to halfwave rectify the AC line voltage and causing Sidac 46 to assume a short circuit condition when the AC voltage across its terminals reaches 135 volts. Capacitor 42 immediately charges to this voltage. The capacitor 42 discharges through resistor 44 when Sidac 46 ceases conduction in response to the line voltage falling. The Sidac will not resume its conductive state despite further cycles of the 60 Hz line voltage because of the charge on capacitor 42, which dissipates relatively slowly. The voltage across the terminals of Sidac 46 is that of the positive half of the AC line minus the voltage across capacitor 42. When the voltage across capacitor 42 has fallen to about 25 volts, Sidac 46 will resume its conductive state when the line voltage again rises to a point where the voltage across the Sidac terminals is 135 volts.

While peak current flow in the power circuit 28 is very high (about 20 amperes), the duration or time of the current flow is very short, on the order of 2 microseconds. This represents a signal frequency of about 250 kHz. The result is a very large amplitude, very short duration current at 250 kHz. The large identification signal current sets up a strong magnetic field about the wires of circuit 28 which serves to "swamp out" or override any interference signals that may be associated with circuit 28 (or any other of the adjacent power circuits). Thus the identification signal flowing in circuit 28 is very large but of very short duration and the magnetic field established thereby is quite strong. This makes the identification signal relatively easy to detect by sensing the magnetic field.

It should be noted that while the identification signal is strong enough to swamp out interfering signals, it does not itself create objectionable interference. Indeed the identification signal is much like the pulse produced when a small capacitor is connected across the power lines, which effectively occurs whenever a computer or similar type device is switched on or off. The difference is that with the invention, the relaxation oscillator generates the identification signal at a repetition rate that is selected to differ from any other signals that might be present on or near the circuit 28. In accordance with the invention, a repetition rate of about 7 cycles per second is selected for the identification signal.

In FIG. 3 a battery 48 supplies power through a switch 50 to a bypass capacitor 52. A transistor 54 has its collector connected through a load resistor 56 to the source of battery power and its emitter is connected through a resistor 58 to ground. A capacitor 60 and a variable resistor 62 is connected in parallel with emitter resistor 58. Resistor 62 sets the sensitivity of the amplification stage that includes transistor 54, as will be explained. A voltage divider, consisting of resistor 64 and a resistor 66 connected in series with resistor 56, establishes the base voltage for transistor 54. A bypass capacitor 68 is coupled across resistor 66 and a pickup coil 70, connected in parallel with a capacitor 72, connects the junction of resistors 64 and 66 to the base of transistor 54. Pickup coil 70 is used to sense the magnetic field that is generated by the identification signal flowing in circuit 28. The pickup coil 70 is moved close to and with the axis of the pickup coil parallel to circuit breakers 12, 14, 16, etc. to identify the one that is in the circuit supplying the identification signal to outlet 32. In a typical configuration, pickup coil 70 will be located across the small end of a rectangular receiver box and the box will be simply moved at right angles across the circuit breakers.

A timer 80, which may be a conventional off-the-shelf type 555, is provided for responding to the output of transistor 54 to generate a stretched pulse or timing signal for a time period that is determined by resistor 82 and capacitor 84. The numbers on timer 80 indicate the pin numbers of a 555 type device. Pin 1 is grounded, pin 2 is the input for the identification signal, pin 3 is the output, pins 4 and 8 are connected to B+voltage, pin 5 is connected to ground through a capacitor 86, and pins 6 and 7 are connected together to the junction of resistor 82 and capacitor 84. The output of timer 80 (pin 3) is connected to a pair of output devices which may be used alone or in combination. An LED 88 is connected in series with a current limiting resistor 90 to ground to provide a visual indication when timer 80 is operated. Also connected across pin 3 is a piezoelectric alarm or buzzer 92 which may be incorporated at the option of the designer. A testing feature is provided by a diode 74 connected in series with the parallel combination of a capacitor 76 and a resistor 78 between pin 2 and ground. This circuit provides an initial, one-time output signal from timer 80 when switch 50 is closed to indicate that the receiver is operational.

In operation, receiver 36 is hand-held and moved with the longitudinal axis of pickup coil 70 substantially parallel to the circuit breakers 12, 14, etc. in electrical power panel 10. The identification signal produced when passive signal device 34 is coupled to outlet 32 develops a strong magnetic field that will likely be sensed in the vicinity of a number of circuit breakers including the one that is actually carrying the current flowing to circuit 28 to which outlet 32 is connected. When switch 50 in the receiver 36 is closed, timer 80 will generate an output signal. LED 88 will be illuminated for the timing period of timer 80 and buzzer 92 (if used) will sound. Thus the user is provided with an indication that the receiver 36 is working.

This initial operation of timer 80 occurs because capacitor 76, which is initially discharged, charges through diode 74 and develops a signal on pin 2 of timer 80. Once capacitor 76 charges, a stable DC level appears at pin 2 and timer 80 doesn't continue to operate. If a magnetic field of close to the 250 kHz frequency is picked up by pickup coil 70, transistor 54 conducts and pulses the input of timer 80, which responds to develop a stretched output signal for producing a visual and an audio indication. As mentioned, with sensitivity control 62 set for maximum sensitivity, receiver 36 will pick up and respond to the magnetic field adjacent to a number of the circuit breakers. The sensitivity control is adjusted to reduce the sensitivity and the receiver 36 is again moved adjacent to the circuit breakers in electrical panel 10. The procedure is repeated until only one circuit breaker triggers transistor 54 to activate timer 80 to generate an output signal. When this occurs, the circuit breaker adjacent to receiver 36 has been identified as the one that is supplying electrical power to the outlet to which the passive signal device 34 is connected. Therefore, the electrician may confidently remove power from that circuit and work on the circuit or on the outlet to which the circuit is connected. It will be further appreciated that when the circuit breaker is opened to interrupt the circuit, verification is obtained since no output signal is produced because timer 80 is not activated. This is because the power supply to signal device 34 is interrupted and the identification signal is not developed. Thus the system includes self-test features which assure the user of its proper operation.

Pickup coil 70 and capacitor 72 are tuned to approximately 250 kHz in the example chosen for purposes of description. Tuning, however, is not critical because of the large amplitude identification signal current used. Even with a broad band amplifier arrangement, isolation of the circuit breaker that supplies the outlet is readily attained by adjustment of the sensitivity control. It will also be appreciated that, by adding amplification to the receiver, tracing of the circuit with the pickup coil at a greater distance may be achieved. Indeed tracing of circuit wires that are sheathed in conduit and buried below ground or routed within building walls has been successfully accomplished by adding a second transistor amplifier stage to yield a gain of about 80 for the receiver. Thus an additional benefit is derived where the electrician wishes to trace the actual routing of a particular circuit within the structure of a building.

As mentioned previously, the identification signal, while of very large amplitude, is of such short duration that it causes no discernible interference problems with equipment on the power lines. Yet its large amplitude creates a swamping magnetic field that overrides other potentially interfering signals and its repetition rate is readily discernible from all other signals. It thus makes for a very simple and low cost hand-held receiver. In this respect it differs significantly from line carrier signalling devices.

What has been described is a novel, low cost reliable circuit locating device for identifying a power circuit that supplies a given power outlet. It is recognized that numerous modifications and changes in the described embodiment of the invention will be apparent to those skilled in the art without departing from its true spirit and scope. The invention is to be limited only as defined in the claims.

What is claimed is:

1. A power circuit locater for identifying a circuit interrupter for a low frequency AC power line among a plurality of similar circuit interrupters for respective ones of a plurality of adjacent power lines, comprising:
    a passive plug in load device including a relaxation oscillator for developing a very low frequency series of very large amplitude, short duration identification pulses in a selected power line circuit to produce a corresponding magnetic field adjacent its corresponding circuit interrupter and magnetic fields of lesser strength in the vicinity of others of said adjacent power lines;
    pickup means movable within the vicinity of all of said circuit interrupters for sensing all said magnetic fields;
    trigger means including broadly tuned high frequency amplifier means operated in response to said pickup means;
    sensitivity means coupled to said trigger means for reducing the sensitivity of said trigger means to all said magnetic fields for responding only to said corresponding magnetic field; and
    signalling means operated by said trigger means for indicating that said corresponding magnetic field has been sensed.

2. The circuit of claim 1 wherein said trigger means includes a timer circuit operated in response to said trigger means for developing a signal for operating said signalling means.

3. The circuit of claim 2 wherein said timer circuit includes a test circuit for yielding an indication that said timer is operating when said timer is initially turned on.

4. The circuit of claim 1 wherein said relaxation oscillator includes a capacitor for providing said very large amplitude identification pulses and for providing a timing function in said relaxation oscillator.

* * * * *

REEXAMINATION CERTIFICATE (2477th)
United States Patent [19]
Konopka

[11] B1 4,906,938

[45] Certificate Issued Feb. 14, 1995

[54] POWER CIRCUIT LOCATOR

[75] Inventor: John G. Konopka, Barrington, Ill.

[73] Assignee: Zenith Electronics Corporation, Glenview, Ill.

Reexamination Request:
No. 90/003,332, Feb. 8, 1994

Reexamination Certificate for:
Patent No.: 4,906,938
Issued: Mar. 6, 1990
Appl. No.: 232,961
Filed: Aug. 16, 1988

[51] Int. Cl.⁶ ............ G01R 31/02; G01R 31/08
[52] U.S. Cl. ............................ 324/529; 324/66
[58] Field of Search ............ 324/66, 67, 71.1, 72, 324/529, 528, 530, 536, 263

[56] References Cited
U.S. PATENT DOCUMENTS
4,121,152 10/1978 Hale .
4,556,839 12/1985 George ......................... 324/66

FOREIGN PATENT DOCUMENTS
2566539 12/1985 France .
1162811 8/1969 United Kingdom .

OTHER PUBLICATIONS
Baggott: "Live Cable Tracing and Identification"—Electrical Supervisor-Jun./Jul. 1975-pp. 5-10.

*Primary Examiner*—Kenneth A. Wieder

[57] ABSTRACT

A circuit locater includes a passive signal device adapted to be plugged into a power outlet to draw a large amplitude current pulse of very short duration (identification signal) from the power source supplying the outlet. A receiver has a pickup coil that senses the magnetic field generated by the identification signal current. A sensitivity control reduces the sensitivity of the pickup coil until an output signal is produced only when the receiving coil is adjacent to the circuit breaker of the electrical control panel that is supplying power to the passive signal device.

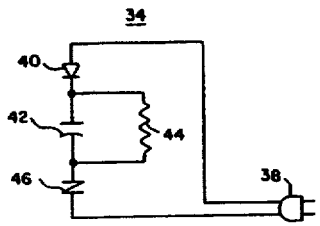

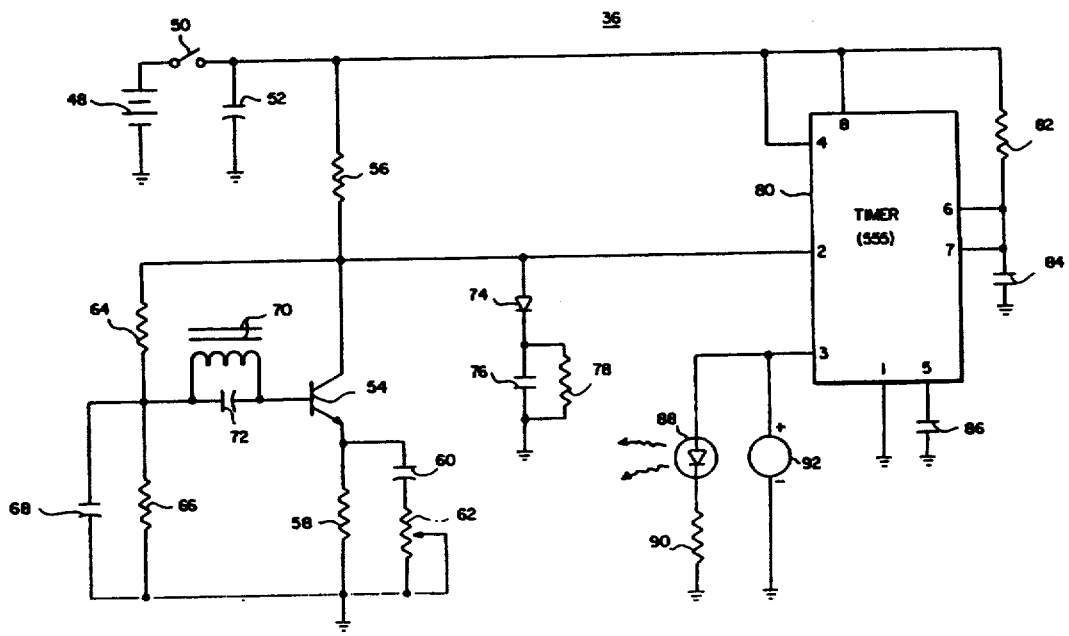

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-4 is confirmed.

* * * * *